(12) United States Patent
Honda et al.

(10) Patent No.: US 7,718,970 B2
(45) Date of Patent: May 18, 2010

(54) INFRARED DETECTION UNIT USING A SEMICONDUCTOR OPTICAL LENS

(75) Inventors: Yoshiaki Honda, Souraku-gun (JP); Takayuki Nishikawa, Osaka (JP); Tomohiro Kamitsu, Kobe (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 208 days.

(21) Appl. No.: 12/094,964

(22) PCT Filed: Nov. 24, 2006

(86) PCT No.: PCT/JP2006/324044

§ 371 (c)(1),
(2), (4) Date: May 23, 2008

(87) PCT Pub. No.: WO2007/061137

PCT Pub. Date: May 31, 2007

(65) Prior Publication Data

US 2009/0266988 A1    Oct. 29, 2009

(30) Foreign Application Priority Data

Nov. 25, 2005  (JP) .............................. 2005-341213
Mar. 28, 2006  (JP) .............................. 2006-089602

(51) Int. Cl.
*G01J 5/02* (2006.01)
(52) U.S. Cl. ..................................... 250/353
(58) Field of Classification Search .................. 250/353
See application file for complete search history.

(56) References Cited

U.S. PATENT DOCUMENTS

| 4,415,414 A | 11/1983 | Burton et al. |
| 5,634,846 A | 6/1997 | Lee et al. |
| 6,653,701 B1 * | 11/2003 | Yamazaki et al. ........... 257/414 |

FOREIGN PATENT DOCUMENTS

| EP | 1 139 080 A2 | 10/2001 |
| JP | 4-1535 A | 1/1992 |

(Continued)

OTHER PUBLICATIONS

International Search Report for the Application No. PCT/JP2006/324044 mailed Feb. 15, 2007.

(Continued)

*Primary Examiner*—David P Porta
*Assistant Examiner*—Kiho Kim
(74) *Attorney, Agent, or Firm*—Cheng Law Group, PLLC (57) ABSTRACT

An infrared detection unit includes a base carrying an infrared sensor element, and a cap configured to be fitted on the base to surround the infrared sensor element. The cap has a top wall with a window in which a semiconductor lens is fitted to collect an infrared radiation onto the infrared sensor element. The semiconductor optical lens is formed from a semiconductor substrate to have a convex lens and a flange which surround said convex lens. An infrared barrier is formed on the semiconductor lens to block the infrared radiation from passing through the boundary between the circumference of the convex lens and the window. Accordingly, the infrared sensor element can receive only the infrared radiation originating from a detection area intended by the convex lens.

9 Claims, 8 Drawing Sheets

FOREIGN PATENT DOCUMENTS

| | | |
|---|---|---|
| JP | 5-133803 A | 5/1993 |
| JP | 05-133803 A | 5/1993 |
| JP | 5-256695 A | 10/1993 |
| JP | 8-296885 A | 11/1996 |
| JP | 9-297064 A | 11/1997 |
| JP | 9-311072 A | 12/1997 |
| JP | 2000-263556 A | 9/2000 |
| JP | 2003-273067 A | 9/2003 |
| JP | 2006-58228 A | 3/2006 |
| JP | 2006-153675 A | 6/2006 |
| JP | 2006-329950 A | 12/2006 |
| JP | 3897055 B1 | 1/2007 |
| JP | 3897056 B1 | 1/2007 |
| JP | 2007-86766 A | 4/2007 |
| JP | 2007-86767 A | 4/2007 |
| JP | 2007-86768 A | 4/2007 |
| JP | 2007-86769 A | 4/2007 |
| JP | 2007-86770 A | 4/2007 |

OTHER PUBLICATIONS

Notification of Reasons for Refusal for the Application No. 2006-319071 from Japan Patent Office mailed Feb. 13, 2007.
Notification of Reasons for Refusal for the Application No. 2006-319071 from Japan Patent Office mailed Aug. 7, 2007.
Notification of Reasons for Refusal for the Application No. 2006-319071 from Japan Patent Office mailed Jan. 22, 2008.

* cited by examiner

INFRARED DETECTION UNIT USING A SEMICONDUCTOR OPTICAL LENS

TECHNICAL FIELD

The present invention is directed to an infrared detection unit, more particularly to an infrared detection unit utilizing a semiconductor optical lens for collecting an infrared radiation to an infrared sensor element.

BACKGROUND ART

Japanese patent publication No. 5-133803 discloses an infrared detection unit utilizing an optical lens for collecting the infrared radiation to an infrared sensor element. The infrared sensor element is enclosed in a housing with a top opening fitted with the optical lens. Recently, there has been proposed a technology for fabricating for a mold for a micro optical lens as disclosed in Japanese patent publication No. 2000-263556. As the infrared detection unit is required to be compact in size, such micro optical lens is most preferable. However, the micro-optical lens prepared in the above prior art is inherently given a uniform radius of curvature, and is not suitable for the infrared radiation unit when it requires a lens having non-uniform radius of curvature for effectively collecting the infrared radiation to the infrared sensor element. Therefore, there is a need to use a semi-conductor lens having a non-uniform radius of curvature. Even if such semiconductor lens is utilized for the infrared detection unit, however, there remains a problem that the infrared radiation passing though the boundary between the semiconductor optical lens and the top opening may be incident upon the infrared sensor element, whereby the infrared radiation originating from an area not intended by the lens causes false detection.

DISCLOSURE OF THE INVENTION

In view of the above problem, the present invention has been accomplished to provide an infrared detection unit in which a semiconductor lens can be successfully utilized for accurate detection. The infrared detection unit in accordance with the present invention includes a base carrying an infrared sensor element, and a cap configured to be fitted on the base to surround the infrared sensor element. The cap has a top wall with a window in which a semiconductor lens is fitted to collect an infrared radiation onto the infrared sensor element. The semiconductor optical lens is formed from a semiconductor substrate to have a convex lens and a flange which surround the convex lens. The flange has a flat face which is held in contact with the top wall of the window at a circumference of the window so as to register the convex lens in the window. The semiconductor optical lens is formed with an infrared barrier at a portion extending from the flange to a circumference of the convex lens in order to block the infrared radiation from being directed to the infrared sensor element through the circumference of the window. Thus, the semiconductor lens can collect the infrared radiation originating from a detection area intended by the convex lens successfully on the infrared sensor element, while blocking the infrared radiation not originating from the detection area and passing through the border between the window and the convex lens, thereby assuring accurate infrared detection.

The semiconductor lens is fabricated by a process which utilizes the semiconductor substrate having a flat top surface and a flat bottom surface opposed to each other. The process includes the steps of forming an anode on the bottom surface, placing the semiconductor substrate in an electrolyte solution. Then, the steps are followed by flowing a current between the anode and a cathode within the solution to convert the top surface of the substrate to a varying depth from portions to portions, leaving a resulting porous layer in the top surface, and removing the porous layer from the substrate to leave a convex surface on the top surface, i.e., the top curved surface of the convex lens. The anode is made of a metal layer which is deposited on the bottom surface to give a consolidated structure, and is configured to give a predetermined distribution of a electric field intensity which varies from portion to portions of the substrate across the top and bottom surfaces of the substrate, thereby providing the porous layer having the varying depth in match with the distribution of the electric field intensity. With the above process, the anode is made integral with the substrate so as to accurately give the distribution of the electric field intensity in exact concordance with a pattern of the anode, thereby making it possible to precisely shape the porous layer and the resulting convex surface. In addition, since the anode is configured to give the predetermined distribution of the electric field intensity varying from portions to portions of the substrate, it is easy to give continuously varying radius of curvature to the resulting curved surface. Further, because of that the anodization proceeds from the top surface of the substrate which is exposed entirely to the electrolyte solution, i.e., not covered or masked by a material restricting the anodization, and that the anodization rate is controlled principally by the anode pattern on the bottom surface of the substrate, it is easy to develop the porous layer of accurately controlled contour or profile and therefore give the correspondingly accurate surface profile to the convex lens. Accordingly, the convex lens with precisely controlled surface profile can be utilized for the infrared detection unit.

Preferably, the cap is made of an electrically conductive material, and the infrared barrier is made of an electrically conductive material which is electrically connected to the cap at the circumference of the window. Thus, the infrared barrier is cooperative with the cap to act also as an electromagnetic shield for the infrared sensor element, thereby effectively protecting the infrared sensor element from an electromagnetic noise.

The infrared barrier may be coupled to the cap by means of an electrically conductive adhesive in order to couple the semiconductor lens mechanically and also electrically to the cap.

It is preferred that the window is square in shape, and that the convex lens is shaped to have a circular outline. In this instance, the infrared barrier is formed to extend along the circumference of the convex lens to define a circular opening which has a diameter smaller than a diameter of the convex lens, thereby eliminating a possibility of collecting the infrared radiation through a boundary between the convex lens and the flange for accurate detection of the infrared radiation only from the intended detection area.

Preferably, the infrared barrier may be electrically coupled to a circuit ground of the infrared sensor element for protecting the infrared sensor from the electromagnetic noise.

The semiconductor lens may be covered with an interference filter which permits only the infrared radiation of a predetermined wavelength band for selective detection of a particular infrared radiating object.

When, the semiconductor lens is configured to include a plurality of the convex lenses, the infrared barrier is formed around the circumference of each of the convex lenses. Particularly, when the convex lenses are arranged circumferentially around a center of the semiconductor lens to leave thereat a dead region not belonging to any one of said convex lenses or not effective for collecting the infrared radiation, the infrared barrier is additionally formed on the semiconductor substrate at a portion corresponding to the dead region for effectively eliminating the undesired infrared radiation from reaching the infrared sensor element.

BEST MODE FOR CARRYING OUT THE INVENTION

Figure 1:
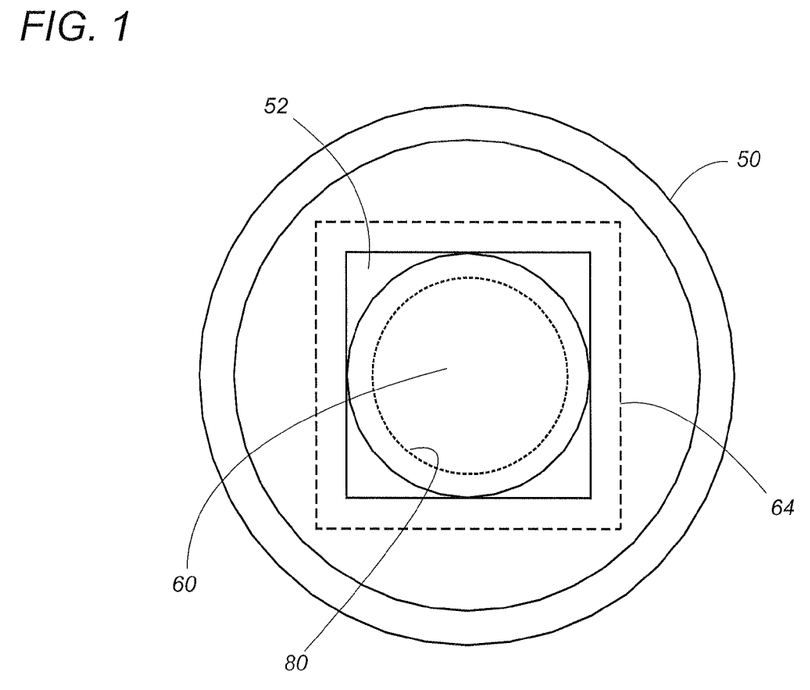
FIG. 1 is a top view of an infrared detection unit in accordance with a first embodiment of the present invention.
Figure 2:
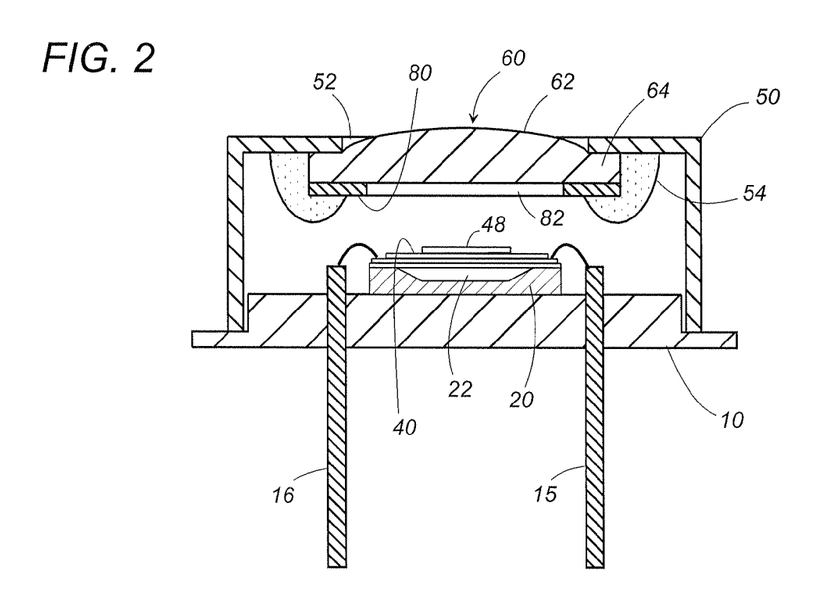
FIG. 2 is a sectional view of the above unit.

Referring to FIGS. 1 and 2, there is shown an infrared detection unit in accordance with a first embodiment of the present invention. The infrared detection unit is adapted in use to be connected with an external signal processing circuit (not shown) for determination of presence of an object or human body emitting an infrared radiation. The detection unit includes a base 10 carrying a thermal infrared sensor element 40 such as a thermistor bolometer, and a metal-made cap 50 which is fitted on the base 10 to surround the sensor element 40. The cap 50 has a square window 52 in its top wall into which a semiconductor lens 60 is fitted to collect infrared radiation onto the sensor element 40. Upon receiving the infrared radiation, the sensor element 40 gives a sensor output indicative of the amount of the infrared radiation. The sensor output is fed through a pair of terminal pins 15 and 16 to the signal processing circuit where it is analyzed for determination of the human presence.

Figure 3:
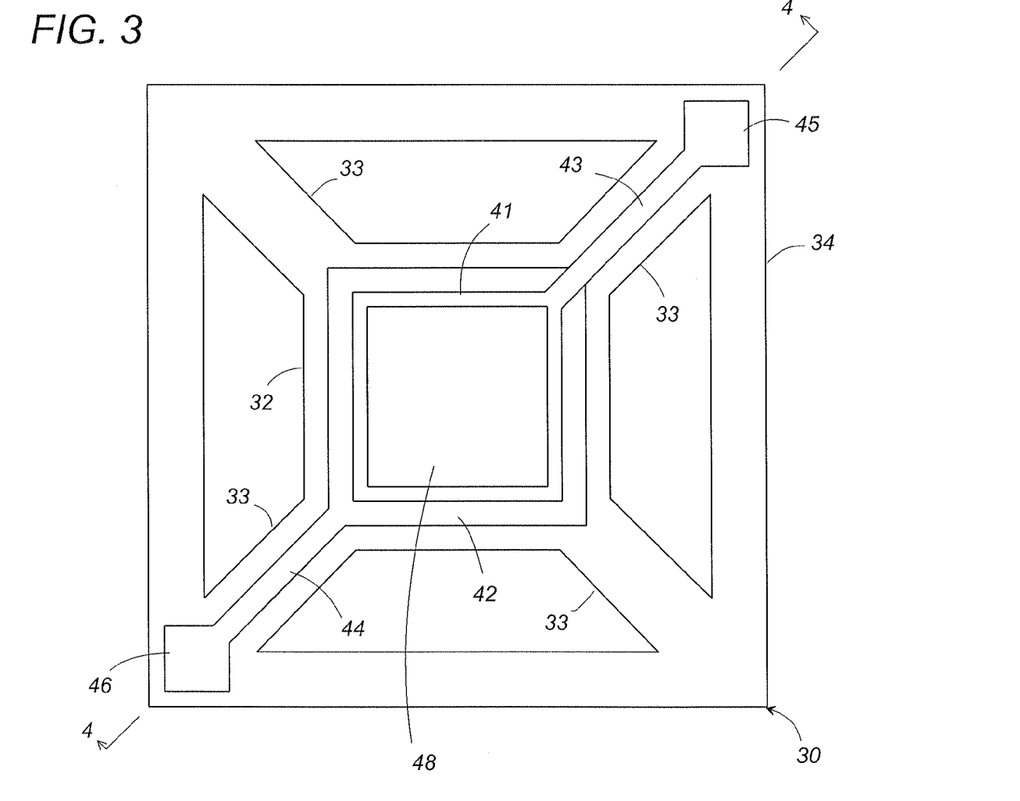
FIG. 3 is a top view of a sensor mount employed in the above detection unit.
Figure 4:
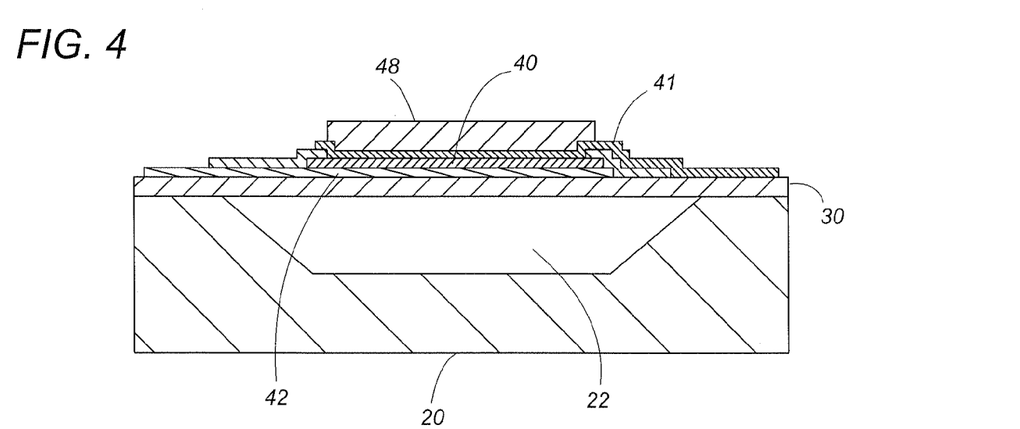
FIG. 4 is a cross-section taken along line 4-4 of FIG. 3.

As shown in FIGS. 3 and 4, the thermal infrared sensor element 40 is held on a substrate 20 and is supported thereto by means of a sensor mount 30 made of a thermally insulating material such as a silicon oxide and silicon nitride. The sensor mount 30 is configured to have a center pad 32 connected to a rectangular frame 34 by means of four diagonal beams 33. The sensor element 40 is disposed on the center pad 32 as being held between an upper electrode 41 and a lower electrode 42. The sensor element 40 is made of an amorphous silicon layer which gives a varying electric resistance in proportion to the amount or intensity of the incident infrared radiation. The upper and lower electrodes 41 and 42 have extensions 43 and 44 leading respectively to terminals 45 and 46 at diametrically opposite ends of the frame 34 for wiring connection to the terminal pins 15 and 16. The center pad 32 is disposed upwardly of a recess 22 in the substrate 20 so as to thermally isolate the sensor element 40 effectively from the substrate 20. The sensor element 40 may be thermally isolated from the substrate 20 by any other supporting structure. An infrared absorber 48 of square planar configuration is deposited on the upper electrode 41 to effectively collect the infrared radiation, and defines an infrared receiving surface on which the infrared radiation is collected through the semiconductor lens 60. The infrared absorber 48 may be formed by SiON, $Si_3N_4$, $SiO_2$, or gold black.

Figure 5:
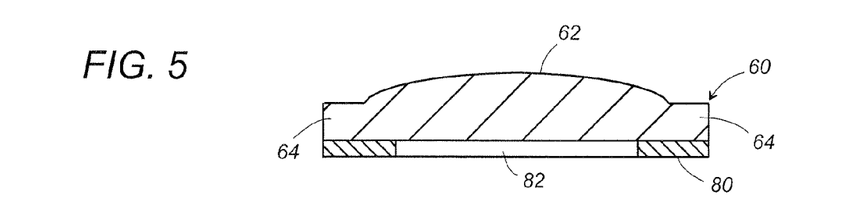
FIG. 5 is a sectional view of a semiconductor lens utilized in the above unit.
Figure 6:
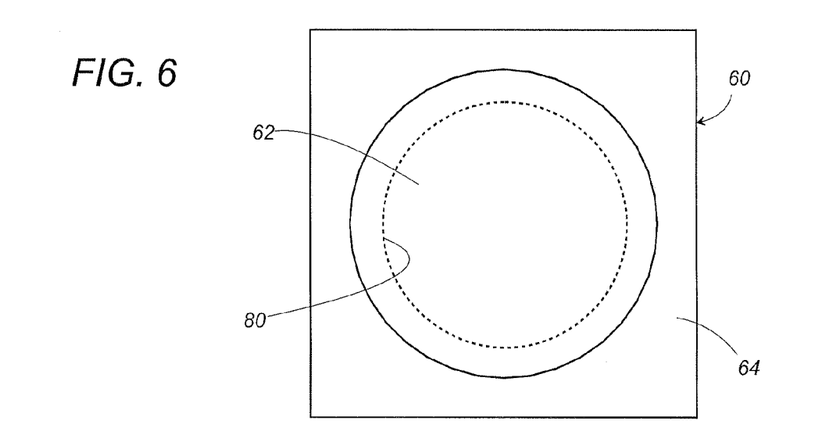
FIG. 6 is a top view of the above lens.

The semiconductor lens 60 is fabricated from a semiconductor material such as, silicon (Si), germanium (Ge), silicon carbide (SiC), gallium arsenide (GaAs), gallium phosphide (GaP), and indium phosphide (InP) to include a piano-convex lens 62 having circular outline and a square-shaped flange 64 surrounding the plano-convex lens 62, as shown in FIGS. 5 and 6. The flange 64 is configured to have a flat top surface and a flat bottom surface coplanar with a flat bottom of piano-convex lens. An infrared barrier 80 is deposited on the bottom of the semiconductor lens 60 to cover the area extending from the flange 64 to the circumferential portion of the piano-convex lens 62. The infrared barrier 80 is made of a metal layer to reflect the infrared radiation in order to protect the infrared sensor element 40 from receiving the infrared radiation not originating from a detection area intended by the convex lens 62, i.e., the infrared radiation passing through the boundary between the circumferential portion of the convex lens 62 and the flange 64, and particularly the infrared radiation passing through the flange 64 exposed at the corners of the square window 52 of the cap 50, as seen in FIG. 1. Thus, it is made to direct the infrared radiation only from the intended area to the sensor element for reliable infrared detection. It is noted in this connection that the window 52 is preferred to be square in shape such that the circular outline of the convex lens 62 is easy to be fit in the circular window 52, while aligning the optical axis of the lens to the sensor element 40. Conversely, if the window is made circular in match with the circular outline of the lens, the window and the convex lens have to be finished extremely accurately so as to give a uniform contact all over the entire circumference of the convex lens. If the circular outline fails to come into smooth contact with the window even at one point of the circumference, the convex lens cannot be fixed in an exact position, resulting in misalignment of the lens with the sensor element or even the failure of assembling the lens to the cap. Therefore, the square window 52 is most preferred for fitting the convex lens 62 in the window 52 easily and accurately. Accordingly, the infrared barrier 80 is necessary to prevent the infrared radiation from passing through the flange 64 exposed at the corners of the window 52. The infrared barrier 80 may be made of a material an infrared reflective index of 0.8 or more such as Al, Au, Ag, Rt, Ni, Mo, W, Cr, Cu, Fe, Ti, Ta, brass, Nb, Co, or any other metallic material.

Further, the infrared barrier 80 is shaped to have a circular opening 82 of which diameter is smaller than the diameter of the convex lens 62 in order to kill the marginal portion of the convex lens which may be inaccurate in surface configuration when fabricating the lens as will be discussed hereinafter.

Figure 7:
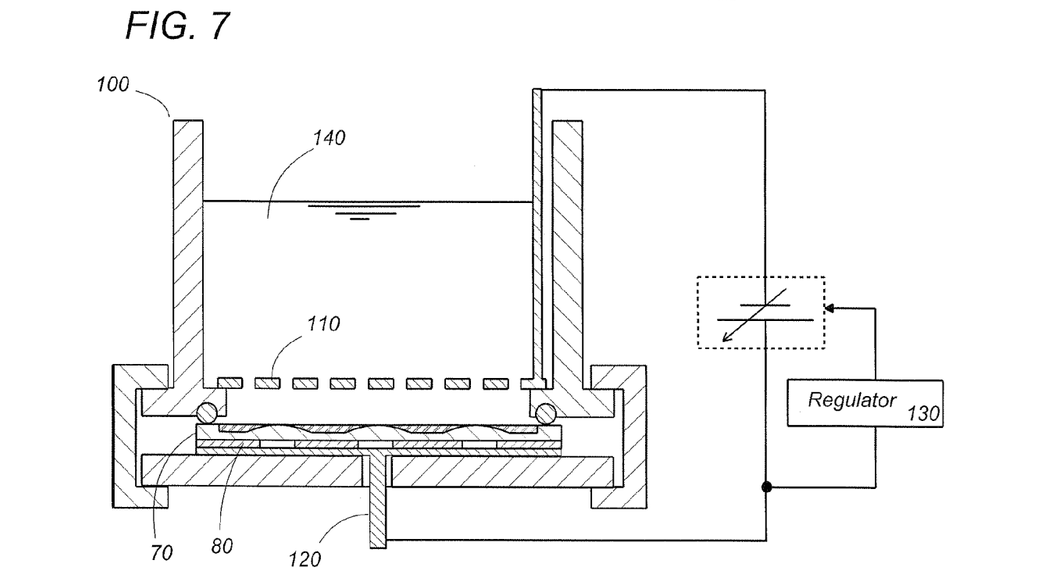
FIG. 7 is a sectional view of an anodizing apparatus utilized for fabricating the above lens.

In this embodiment, the semiconductor substrate 70 of p-type Si is utilized to fabricate the plano-convex lens by selective anodization of the substrate 70. The anodization is made by use of an anodizing apparatus 100 which, as shown in FIG. 7, is configured to place the substrate 70 within a volume of an electrolyte solution 140, and which is configured to be equipped with a regulator 130 for regulation of an electric current flowing between an anodic electrode 120 and a cathode 110 immersed in the solution. The anodic electrode 120 is held in contact with the bottom surface of substrate 70 in order to advance the anodization to a varying extent in the top surface opposed to the cathode 110.

Figure 8A:
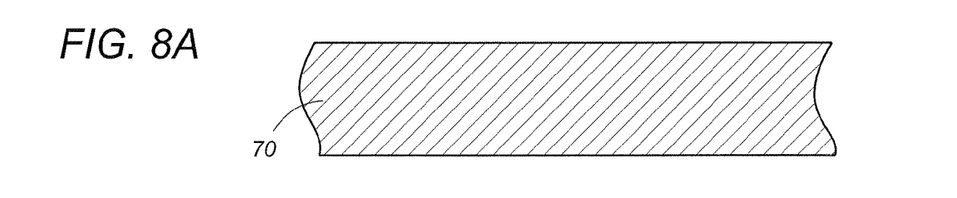
FIGS. 8A to 8E are sectional views illustrating the steps of fabricating the lens.
Figure 8B:
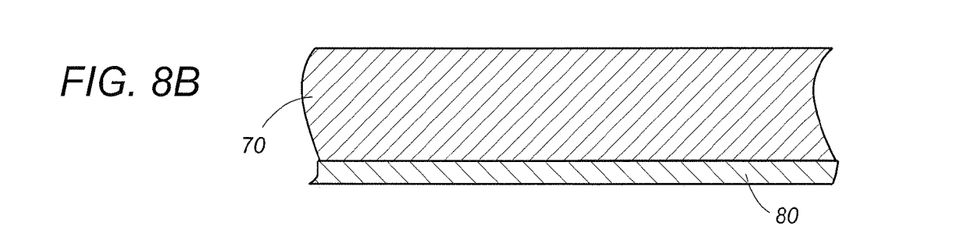
Figure 8C:
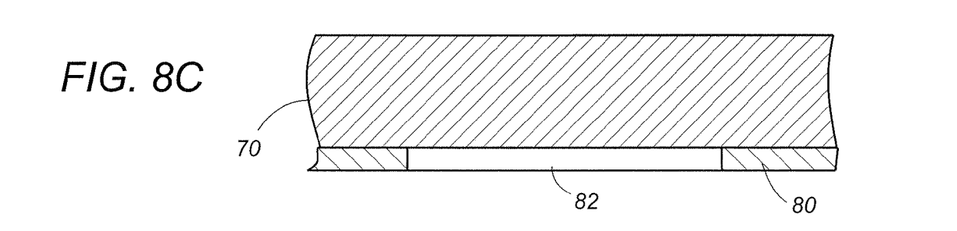
Figure 8D:
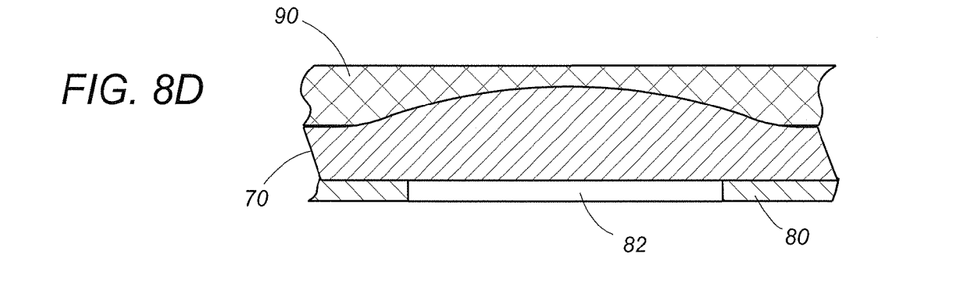
Figure 8E:
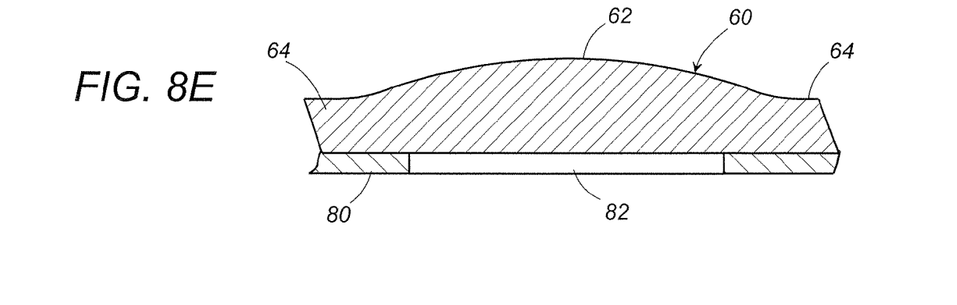

In this embodiment, the substrate 70 is selected to have a low resistance of several ohm centimeters (Ω·cm) to several hundreds ohm centimeters (Ω·cm). For example, a 0.5 mm thick flat p-type Si substrate 70 of 80 Ω·cm is shaped into the lens through the steps of FIGS. 8A to 8E. After being washed and cleaned, the substrate 70 is processed to have an electrically conductive layer 80 on the entire bottom surface (FIG. 8B). The conductive layer 80, which defines the infrared barrier, is made of aluminum, for example, and is deposited by spattering or like technique on the substrate 70 to have a uniform thickness of 1 μm. Then, the conductive layer 80 is formed with a resist pattern by a photolithography, and is partially etched out by a wet-etching to leave a circular opening 82 of 2 mm diameters in match with a diameter of the lens to be fabricated to give a consolidated structure in which the conductive layer 80 defines an anode integrated to the substrate 70 (FIG. 8C). The above etching is not limited to the wet-etching and may be made by a dry-etching. Hereinafter, the term "anode" is utilized in place of the conductive layer or the infrared barrier where it is deemed appropriate to explain the fabrication process of the semiconductor lens. Subsequently, the substrate 70 is immersed within the electrolyte solution 140 in the anodizing apparatus 100 with the anode 80 in contact with the anodic electrode 120 and is followed by receiving an electric current flowing between the anode 80 and the cathode 110 so as to anodize the top surface of the semiconductor substrate 70 selectively in correspondence to the anode pattern, thereby developing a porous layer 90 in the top surface of the substrate 70 (FIG. 8D). The electric current is regulated by the regulator 130 to have a predetermined current density of 30 mA/cm², for example, and continue for a predetermined period of 120 minutes for example. Thereafter, the porous layer 90 is etched out to obtain the semiconductor lens 60 in which the anode remains on the bottom of the lens to define the infrared barrier 80 (FIG. 8E).

The electrolyte solution utilized is an aqueous solution of hydrogen fluoride (HF) and ethanol mixed in a suitable ratio. In the anodization process, the following chemical reactions take place:

$$Si+2HF+(2-n)h^+ \rightarrow SiF_2+2H^++n \cdot e^-$$

$$SiF_2+2HF \rightarrow SiF_4+H_2$$

$$SiF_4+2HF \rightarrow SiH_2F_6$$

where h⁺ denotes a hole and e⁻ denotes an electron.

As soon as the Si substrate is anodically oxidized, the oxidized portion is removed by reaction with the electrolyte solution so as to leave the porous layer 90 in the surface of the substrate 70. Accordingly, the anodization proceeds without being retarded by the oxidized portion, which makes it possible to develop the porous layer 90 having a greater depth, and therefore enable to fabricate the lens of relatively great thickness.

Figure 9:
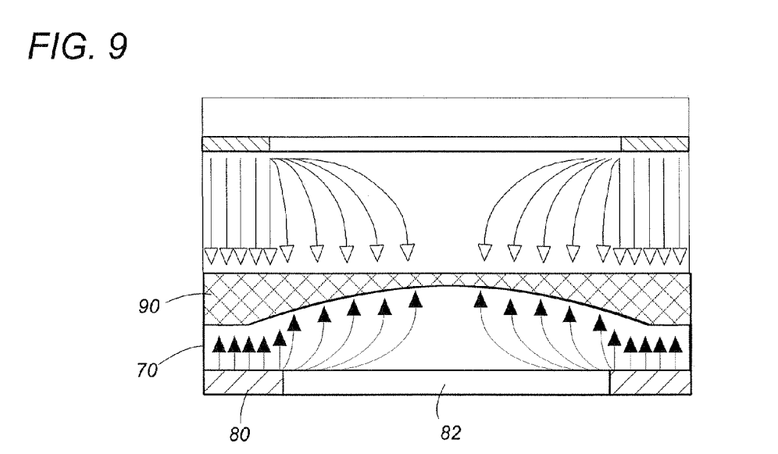
FIG. 9 is a schematic view illustrating electric field intensity distribution developed in the process of fabricating the lens.

As schematically shown in FIG. 9, an in-plane electric field strength or current density is variably distributed in coincidence with the anode pattern. In the figure, the lines with black arrows indicate paths of the positive current flowing through the substrate 70, while the lines with white arrows indicate the paths of the electrons flowing through the substrate 70. Since the in-plane current density becomes denser towards the periphery of the opening 82 than at the center of the opening, the resulting porous layer 90 has a continuously varying depth which is greater towards the periphery of opening 82 than at the center of the opening. Consequently, the plano-convex lens is obtained by removal of the porous layer 90. The distribution of the in-plane electric field strength will be determined primarily by the anode pattern, and secondarily by the resistivity and the thickness of the substrate 70, resistance of the electrolyte solution 140, a distance between the substrate 70 and the cathode 110, and a planar configuration of the cathode 110 (i.e. cathode arrangement in a plane parallel to the substrate). Accordingly, it is readily possible to give any desired lens profile by suitably selecting these parameters in combination with the anode pattern. It should be noted here that since the anodization proceeds to develop the porous layer continuously without being retarded by otherwise appearing oxidized portions in the substrate, the thick lens can be easily fabricated in a single anodization process, which enhances flexibility of the lens design.

In the anodization process, the regulator 130 acts to keep the current density basically at a constant level. However, it is preferred to decrease the current density gradually in a final stage of the anodization process in order to correspondingly decrease the rate of developing the porous layer 90. With this technique, the porosity of the porous layer can be lowered by lowering the current density during the anodization, which minimizes surface irregularity on the curved surface revealed by removal of the porous layer, and therefore gives a more smooth surface finish to the resulting lens. The regulation of the current density is made by monitoring the current level or voltage level. The removal of the porous layer 90 can be made by use of an alkali solution such as KOH, NaOH and TMAH (tetramethyl ammonium hydrooxide) or HF solution.

In the present embodiment, the semiconductor lens 60 is designed to have the convex lens 62 having a non-uniform radius of curvature. However, the present invention should not be interpreted to be limited to the use of the convex lens of non-uniform radius of curvature, and may encompass the use of the convex lens having a uniform radius of curvature.

Figure 10:
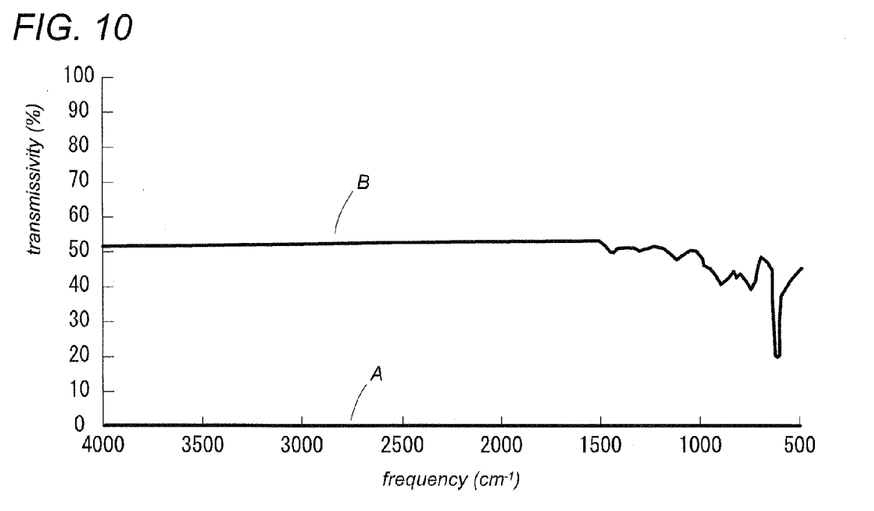
FIG. 10 is a graph illustrating infrared transmissivity with and without an infrared barrier utilized for the above lens.

FIG. 10 demonstrates the effect of the infrared barrier 80 in terms of transmissivity of the infrared radiation. Line (A) shows the transmissivity for the lens having a lens thickness of 0.195 mm with the infrared barrier of 1 μm thick, while line (B) shows the transmissivity of the same lens without the infrared barrier. It is confirmed from FIG. 10 that the infrared barrier 80 can be successful for blocking the infrared radiation. It is noted in this connection that the infrared barrier 80 is not limited to the thickness of 1 μm, and may have less or more thickness.

Turning back to FIG. 1, thus fabricated semiconductor lens 60 is secured to the cap 50 by use of an electrically conductive adhesive 54 which bridges across the infrared barrier 80 and the circumference of the window 52. Thus, the infrared barrier 80 is cooperative with the metal-made cap 50 to act as an additional electromagnetic shield for protection of the sensor element 40 from an external noise or electromagnetic radiation. Preferably, the infrared barrier 80 and the cap 50 are connected to a circuit ground of the sensor element or the signal processing circuit through one of the terminal pins.

Figure 11:
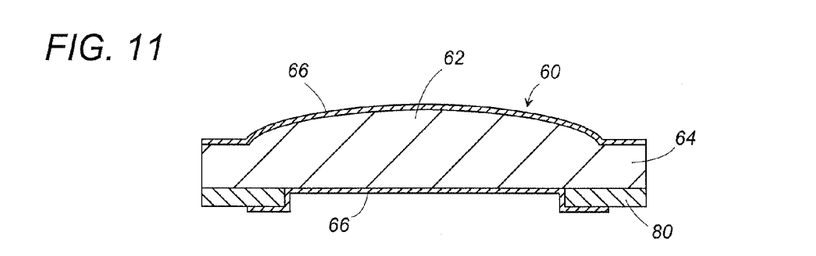
FIG. 11 is a sectional view of the lens added with an interference filter.

As shown in FIG. 11, the semiconductor lens 60 may be additionally covered with an interference filter 66 which permits only the infrared radiation of a predetermined wavelength band for excluding unnecessary infrared radiation. For example, the filter 66 is configured to pass only the infrared radiation having a wavelength of 8 μm to 13 μm, thereby excluding the radiation from the sun or other unintended infrared radiation source to enhance the sensitivity to the intended infrared radiation. The filter 66 may be formed either or both of the top and bottom of the lens.

Figure 12:
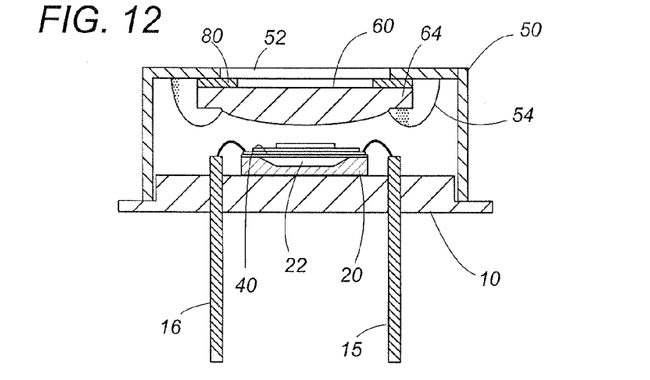
FIG. 12 is a sectional view of infrared detection unit in accordance with a second embodiment of the present invention.

FIG. 12 shows an infrared detection unit in accordance with a second embodiment of the present invention which is basically identical to the first embodiment except that the semiconductor lens 60 is fixed to the cap 50 with its convex face downward. In this case, the infrared barrier 80 can be held in direct contact with the periphery of the window 52 of the cap 50, in addition to that the lens 60 is receded in the cap 50 so as to be protected therein.

Figures 13, 14:
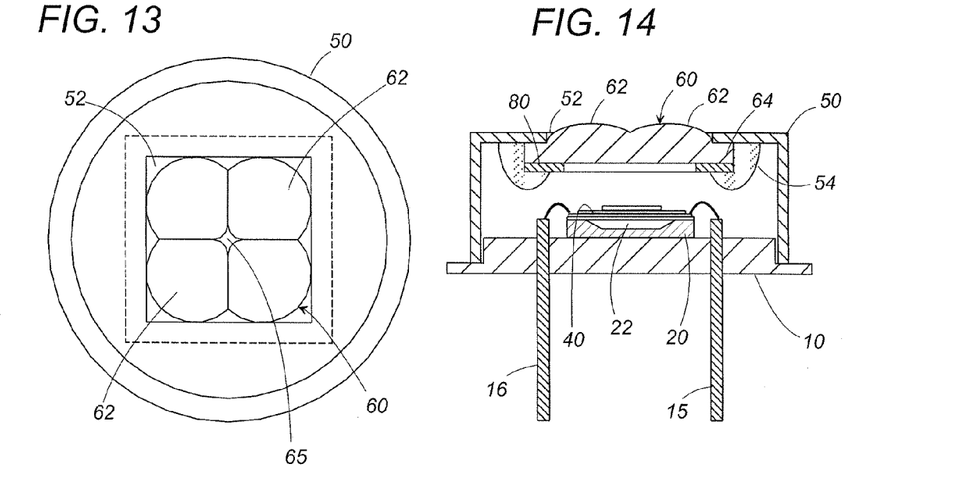
FIG. 13 is top view of infrared detection unit in accordance with a third embodiment of the present invention.
FIG. 14 is a sectional view of the above unit.
Figure 15:
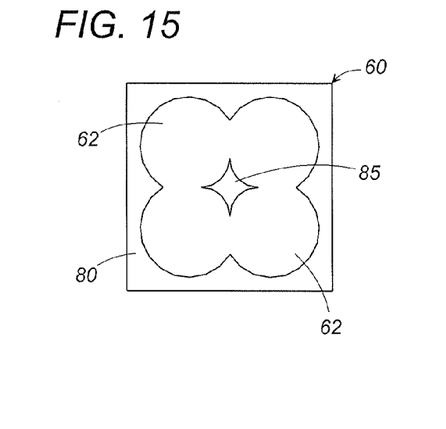
FIG. 15 is a bottom view of a semiconductor lens utilized in the above unit.

FIGS. 13 to 15 show an infrared detection unit in accordance with a third embodiment of the present invention which is basically identical to the first embodiment except that the semiconductor lens 60 is configured to include a plurality of convex lenses 62 for collecting the infrared radiation from a wide detection area. The four convex lenses 62 are equiangularly arranged about a center axis of the semiconductor lens 60 to leave a dead region 65 at the center thereof. In order to prevent the infrared radiation from passing through the dead region 65, the infrared barrier 80 is deposited on the bottom of the semiconductor lens 60 to additionally form a star-shaped center layer 85, as shown in FIG. 15.

Figure 16:
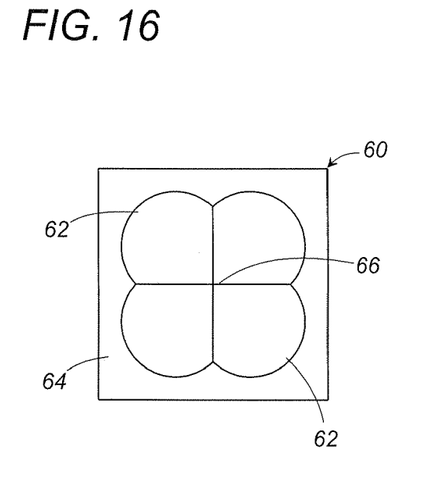
FIG. 16 is a top view of a semiconductor lens in accordance with a modification of the above embodiment.
Figure 17:
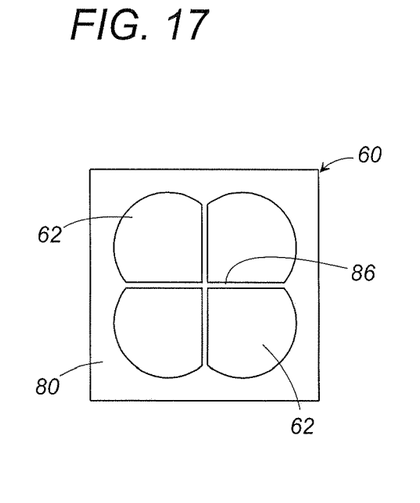
FIG. 17 is a bottom view of the above semiconductor lens.
Figure 18A:
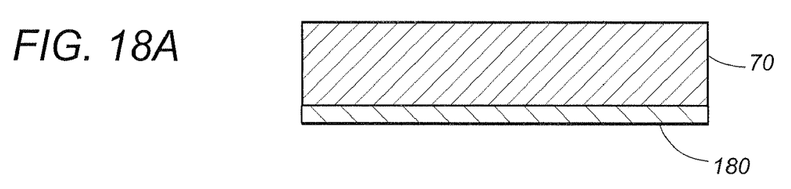
FIGS. 18A to 18G are sectional views illustrating the steps of fabricating a semiconductor lens in accordance with a modification of the above embodiments.
Figure 18B:
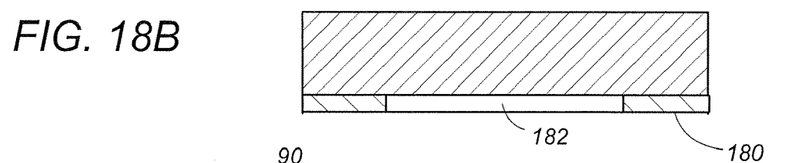
Figure 18C:
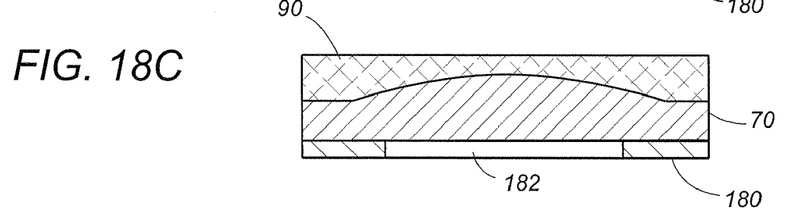
Figure 18D:
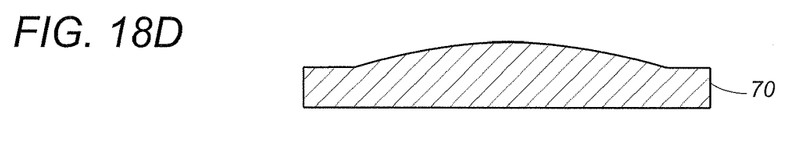
Figure 18E:
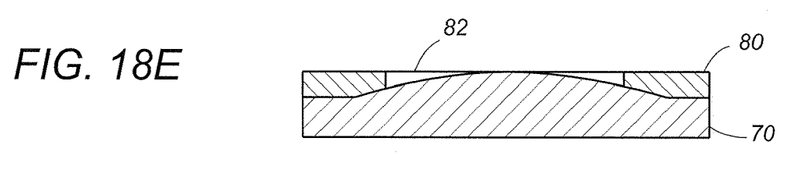
Figure 18F:
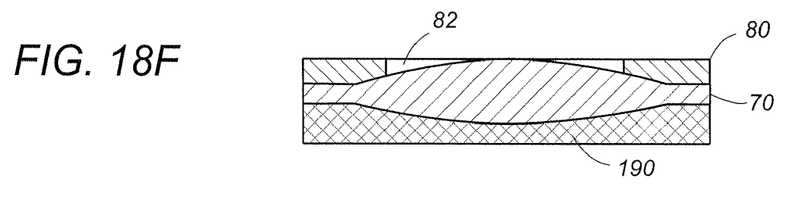
Figure 18G:
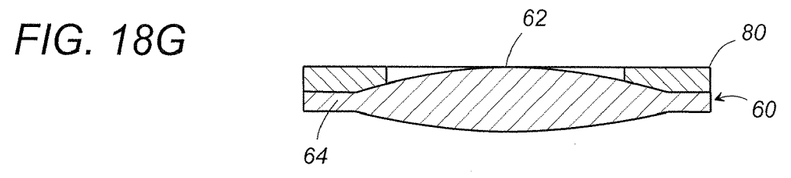

FIGS. 16 and 17 show a modified semiconductor lens 60 which is equally utilized in the present invention. The lens 60 is configured to include four convex lenses 62 with each convex lens partially merging into the adjacent lenses. Also in this modification, the infrared barrier 80 is configured to additionally include a cross-shaped layer 86 in order to prevent the infrared radiation from passing through a dead region 66 formed at the boundary or merging portion between the adjacent lenses 62.

FIG. 18 illustrates the process of fabricating another modified semiconductor lens 60 of double-convex type which is equally utilized in the present invention. The process is similar to the first embodiment except for inclusion of additional anodization process. Firstly, the substrate 70 is formed in its top surface with the convex profile with the use of a preliminary anode 180 having a circular opening 182 through the steps as described in the first embodiment, and as shown in FIGS. 18A to 18C. After etching out the preliminary anode 180, as shown in FIG. 18D, an additional conductive layer 80 with a circular openings 82 is deposited on the top surface with the additional circular openings 82 being disposed in concentric with the already formed convex profile as shown in FIG. 18E. Subsequently, the substrate 70 is anodized to develop an additional porous layer 190 in the bottom surface of the substrate 70, as shown in FIG. 18F. The additional porous layer 190 is etched out, while remaining the additional conductive layer 80 to obtain the semiconductor lens of double-convex type in which the additional conductive layer is left to define the infrared barrier 80, as shown in FIG. 18G. In this manner, the double convex lens can be obtained simply by adding another anodization process.

Although the above embodiments show the use of the infrared sensor element which exhibits an electrical resistance varying in response to the amount or changing rate of the amount of the incident radiation, it is equally possible to utilize an infrared sensor of a type exhibiting a varying permittivity, of a thermopile type generating a thermal electromotive force, or of a pyroelectric type generating a voltage difference in response to the change rate of the amount of the infrared radiation.

The invention claimed is:

1. An infrared detection unit comprising:
a base carrying an infrared sensor element;
a cap configured to be fitted on said base to surround said infrared sensor element, said cap having top wall with a window; and
a semiconductor optical lens configured to be fitted in said window to collect an infrared radiation onto said infrared sensor element;
wherein said semiconductor optical lens is formed from a semiconductor substrate to have a convex lens and a flange which surround said convex lens, said flange having a flat face which is held in contact with said top wall of the window at a circumference of said window so as to register said convex lens in said window; and wherein
said semiconductor optical lens is formed with an infrared barrier at a portion extending from said flange to a circumference of said convex lens to block the infrared radiation from being directed to said infrared sensor element through the circumference of said window,
wherein said semiconductor lens is fabricated through the steps of:
preparing said semiconductor substrate having a flat top surface and a flat bottom surface opposed to each other;
forming an anode on said bottom surface,
placing said semiconductor substrate in an electrolyte solution;
flowing a current between said anode and a cathode within said solution to anodize the top surface of said substrate to a varying depth from portions to portions, leaving a porous layer in said top surface; and
removing said porous layer from said substrate to leave a convex surface on said top surface,
said anode being a metal layer which is deposited on said bottom surface to give a consolidated structure and is configured to give a predetermined distribution of a electric field intensity which varies from portion to portions of said substrate across said top and bottom surfaces of said substrate, thereby providing said porous layer having the varying depth in match with the distribution of said electric field intensity, and
said metal layer defining said infrared barrier which reflects the infrared radiation.

2. An infrared detection unit as set forth in claim 1, wherein said cap is made of an electrically conductive material, and said infrared barrier is made of an electrically conductive material which is electrically connected to said cap at the circumference of said window.

3. An infrared detection unit as set forth in claim 2, wherein said infrared barrier is coupled to said cap by means of an electrically conducive adhesive.

4. An infrared detection unit as set forth in claim 1, wherein said window is square, and said convex lens is shaped to have a circular outline, and wherein
said infrared barrier extending along the circumference of said convex lens to define a circular opening which has a diameter smaller than a diameter of said convex lens.

5. An infrared detection unit as set forth in claim 1, wherein said infrared barrier is a metal layer deposited on said semiconductor optical lens to reflect the infrared radiation.

6. An infrared detection unit as set forth in claim 1, wherein said infrared barrier is electrically coupled to a circuit ground of said infrared sensor element through said cap.

7. An infrared detection unit as set forth in claim 1, wherein said semiconductor lens is covered with an interference filter which permits only the infrared radiation of a predetermined wavelength band.

8. An infrared detection unit as set forth in claim 1, wherein said semiconductor lens includes a plurality of said convex lenses, said infrared barrier being formed around the circumference of each of said convex lenses.

9. An infrared detection unit as set forth in claim 8, wherein said convex lenses are arranged circumferentially around a center of said semiconductor lens to leave thereat a dead region not belonging to any one of said convex lenses, said infrared barrier being additionally formed on said semiconductor substrate at a portion corresponding to said dead region.

* * * * *